United States Patent
Schneider et al.

(10) Patent No.: US 7,838,940 B2
(45) Date of Patent: Nov. 23, 2010

(54) DRAIN-EXTENDED FIELD EFFECT TRANSISTOR

(75) Inventors: Jens Schneider, Munich (DE); Harald Gossner, Munich (DE)

(73) Assignee: Infineon Technologies AG, Neubiberg (DE)

( * ) Notice: Subject to any disclaimer, the term of this patent is extended or adjusted under 35 U.S.C. 154(b) by 32 days.

(21) Appl. No.: 11/950,223

(22) Filed: Dec. 4, 2007

(65) Prior Publication Data

US 2009/0140335 A1 Jun. 4, 2009

(51) Int. Cl.
*H01L 29/78* (2006.01)
(52) U.S. Cl. ............... 257/355; 257/339; 257/E29.268; 438/197; 438/296
(58) Field of Classification Search ............. 257/173, 257/336, 339, 341, 343, 355, E29.268, E29.269, 257/360; 438/197, 296
See application file for complete search history.

(56) References Cited

U.S. PATENT DOCUMENTS

| 5,296,393 | A | 3/1994 | Smayling et al. |
| 5,569,949 | A | 10/1996 | Malhi |
| 5,696,010 | A | 12/1997 | Malhi |
| 6,066,879 | A | 5/2000 | Lee et al. |
| 6,365,940 | B1 | 4/2002 | Duvvury et al. |
| 6,624,487 | B1 | 9/2003 | Kunz et al. |
| 6,730,962 | B2* | 5/2004 | Wu ............... 257/336 |
| 6,756,642 | B2 | 6/2004 | Lee et al. |
| 6,804,095 | B2 | 10/2004 | Kunz et al. |
| 2005/0095865 | A1* | 5/2005 | Obeng et al. ......... 438/692 |
| 2005/0112822 | A1 | 5/2005 | Litwin |
| 2005/0285200 | A1* | 12/2005 | Kim ............... 257/360 |
| 2009/0140232 | A1 | 6/2009 | Ufert |

FOREIGN PATENT DOCUMENTS

| DE | 103 03 232 A1 | 8/2003 |
| DE | 10 2006 036 295 A1 | 2/2008 |
| EP | 0 677 876 B1 | 1/2002 |
| WO | WO 2007/011354 A1 | 1/2007 |

* cited by examiner

*Primary Examiner*—Victor A Mandala
*Assistant Examiner*—Scott Stowe
(74) *Attorney, Agent, or Firm*—Slater & Matsil, L.L.P.

(57) ABSTRACT

A drain-extended field effect transistor includes a drain contact region and a drain extension region. The drain-extended field effect transistor further includes an electrostatic discharge protection region that is electrically connected between the drain contact region and the drain extension region to protect the drain-extended field effect transistor against electrostatic discharge. The electrostatic discharge protection region has a dopant concentration level such that in case of an electrostatic discharge event, a base push-out is prevented from reaching the drain contact region.

23 Claims, 10 Drawing Sheets

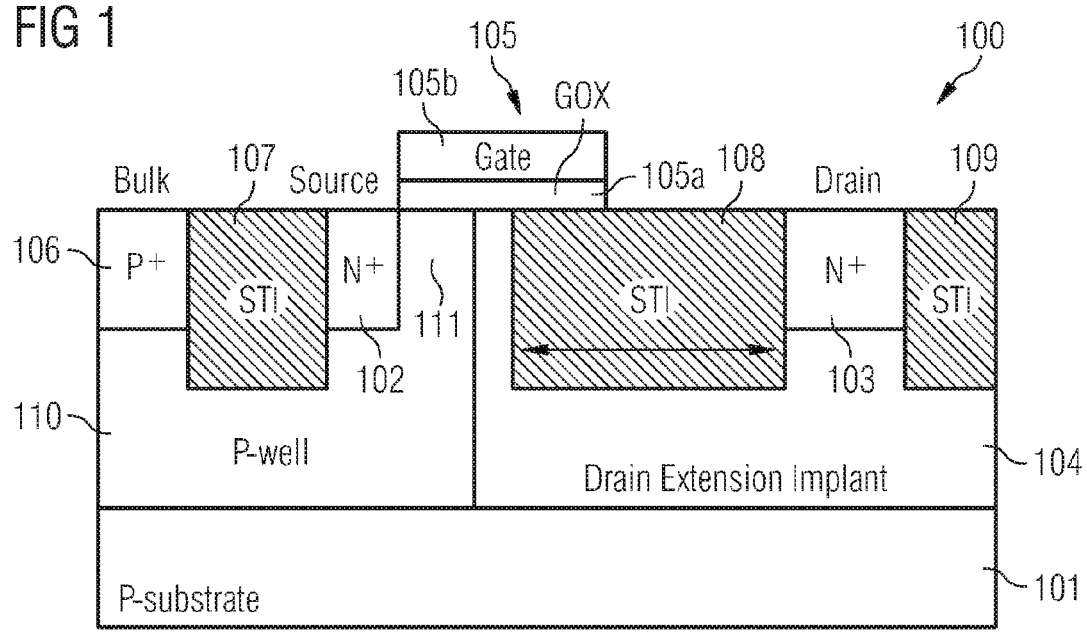
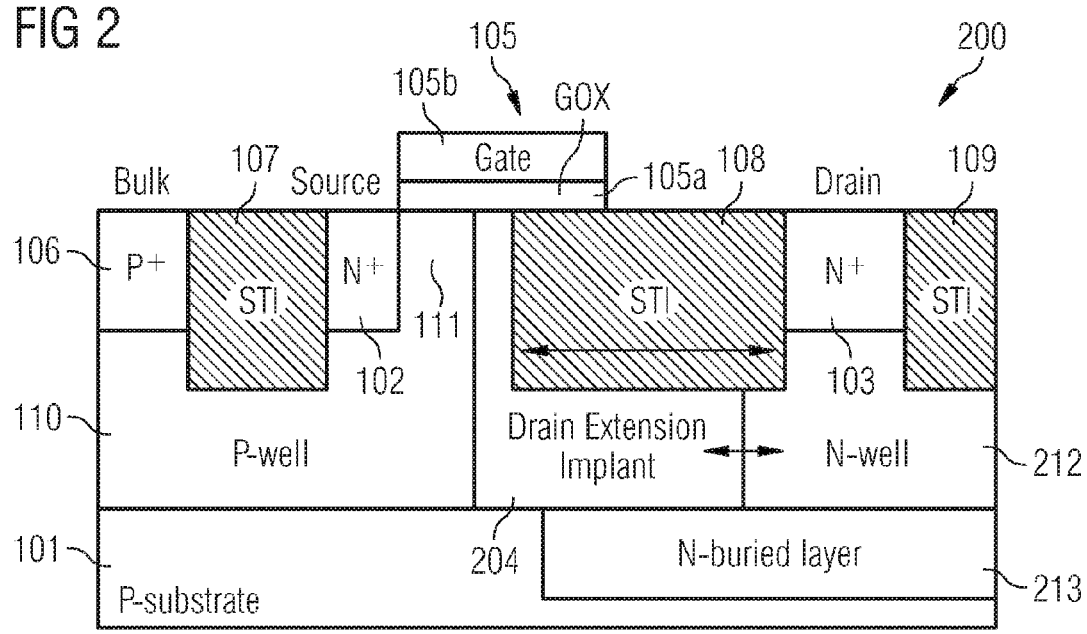

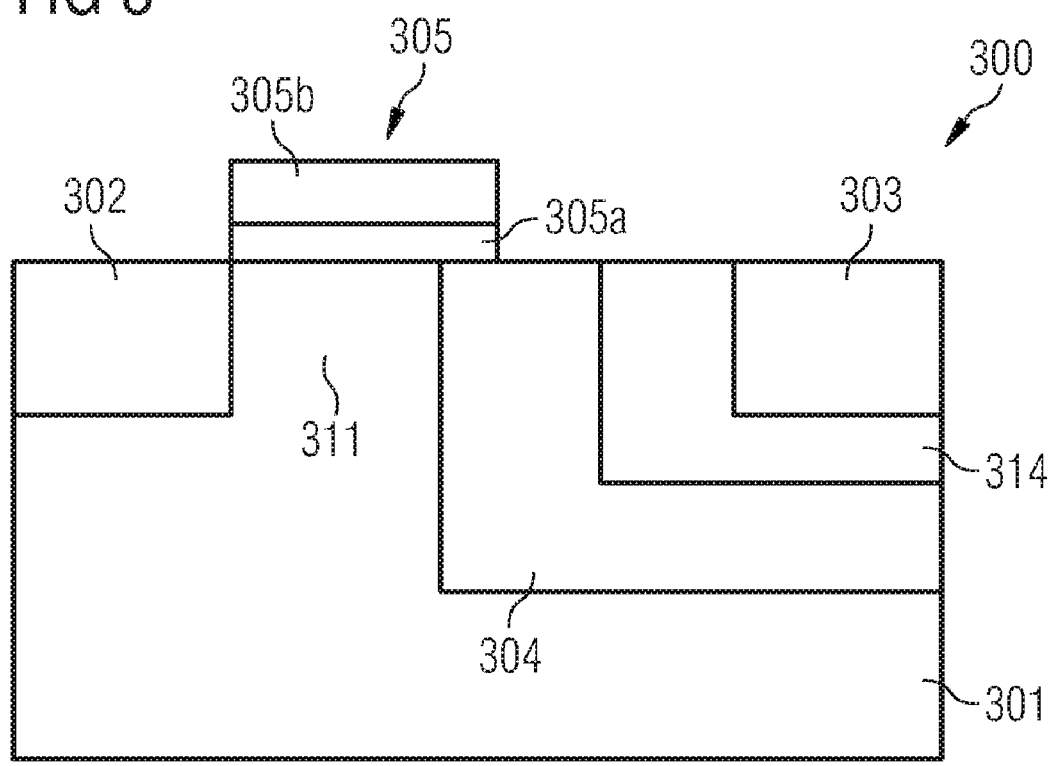

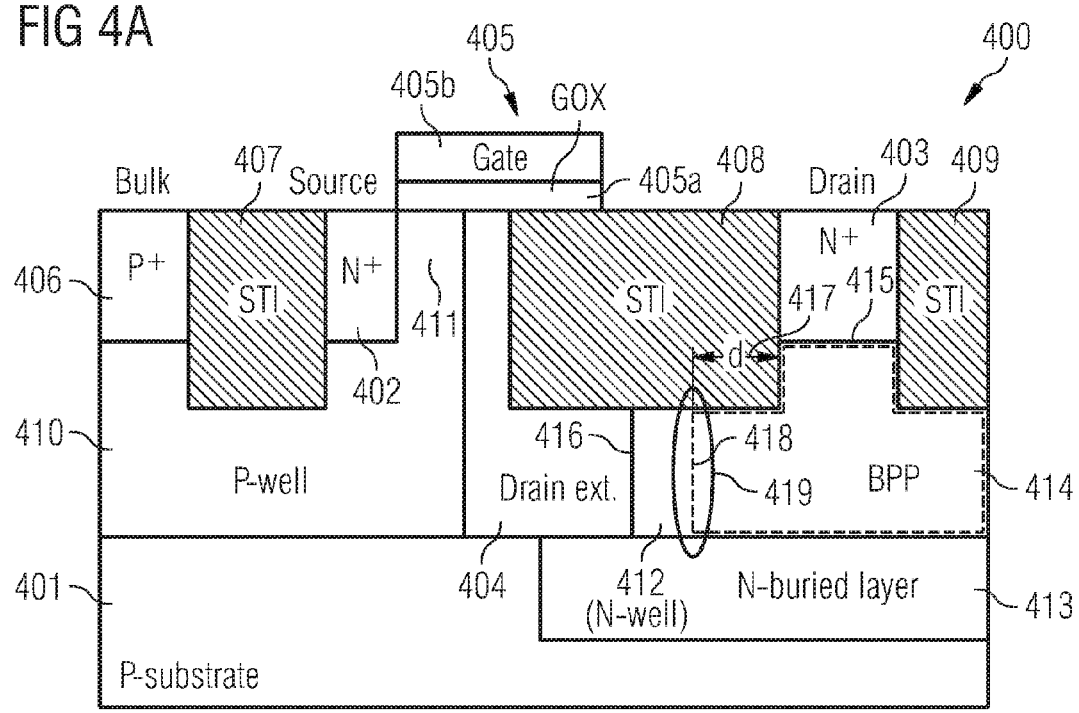
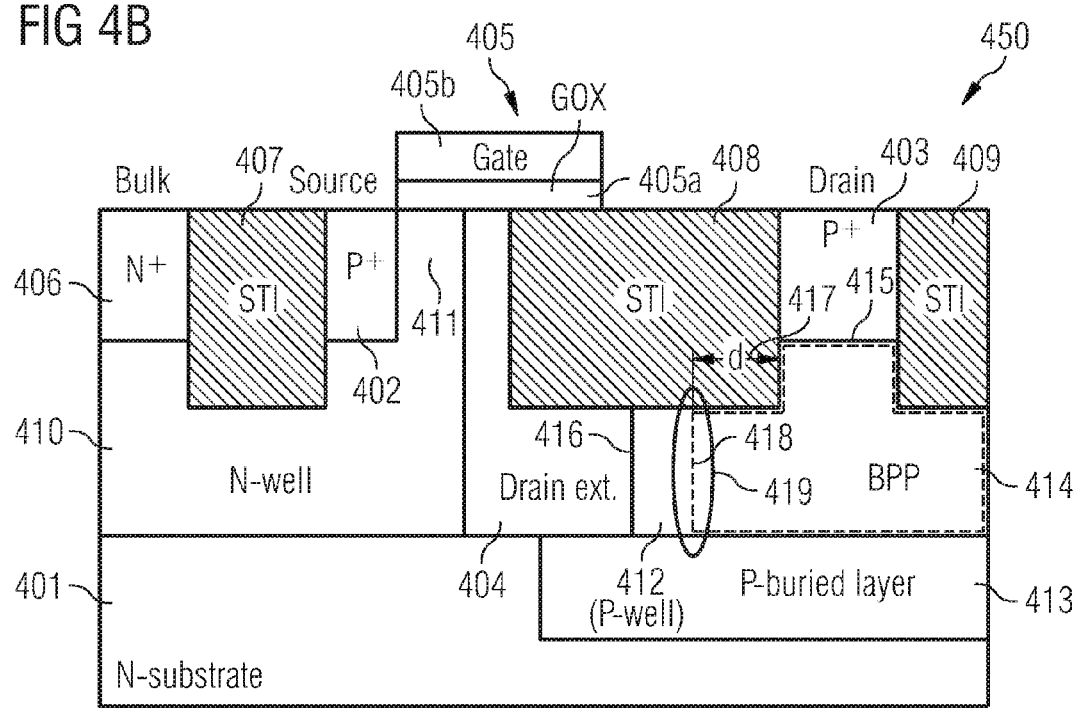

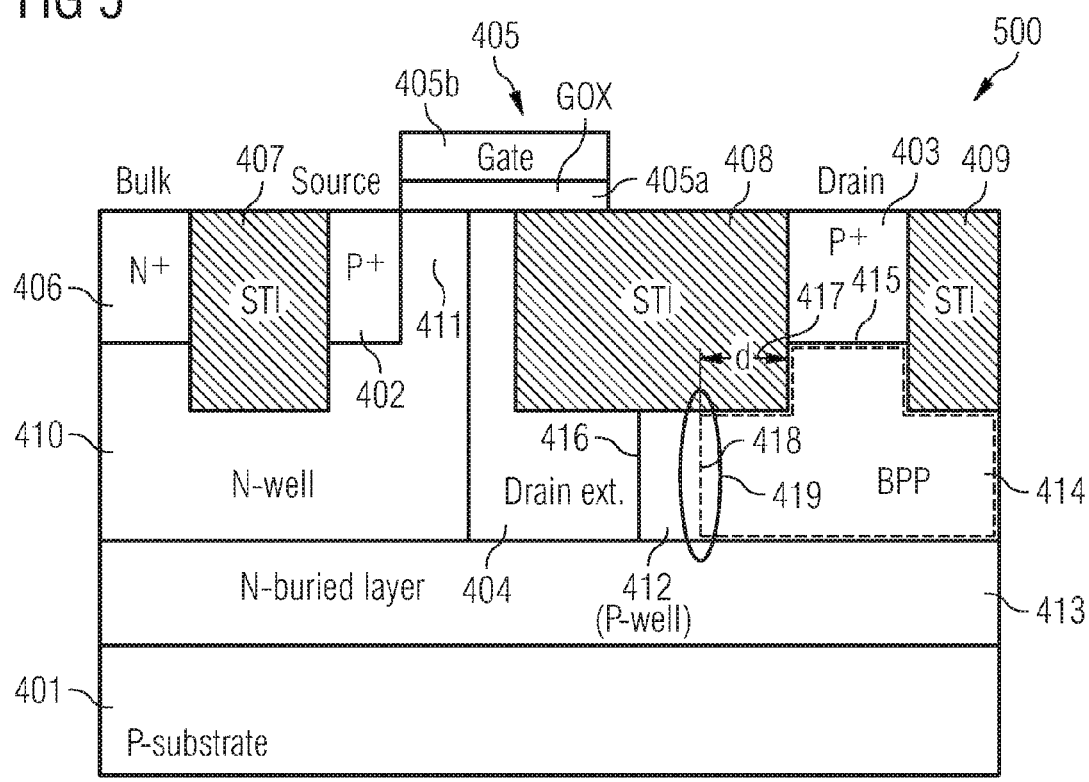

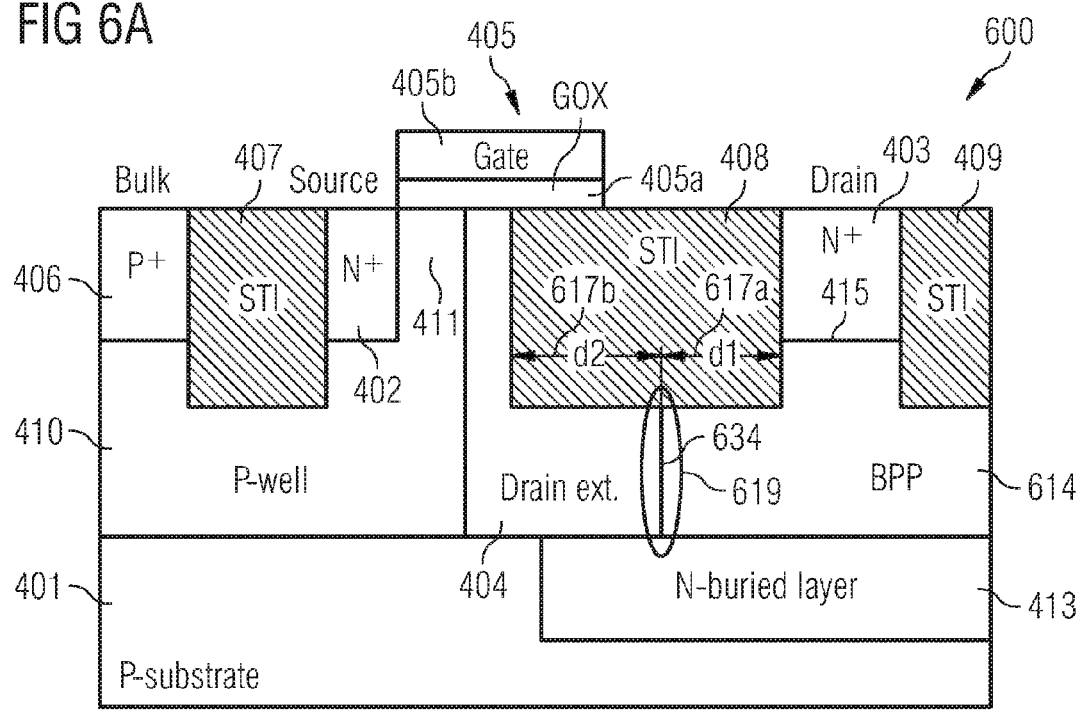
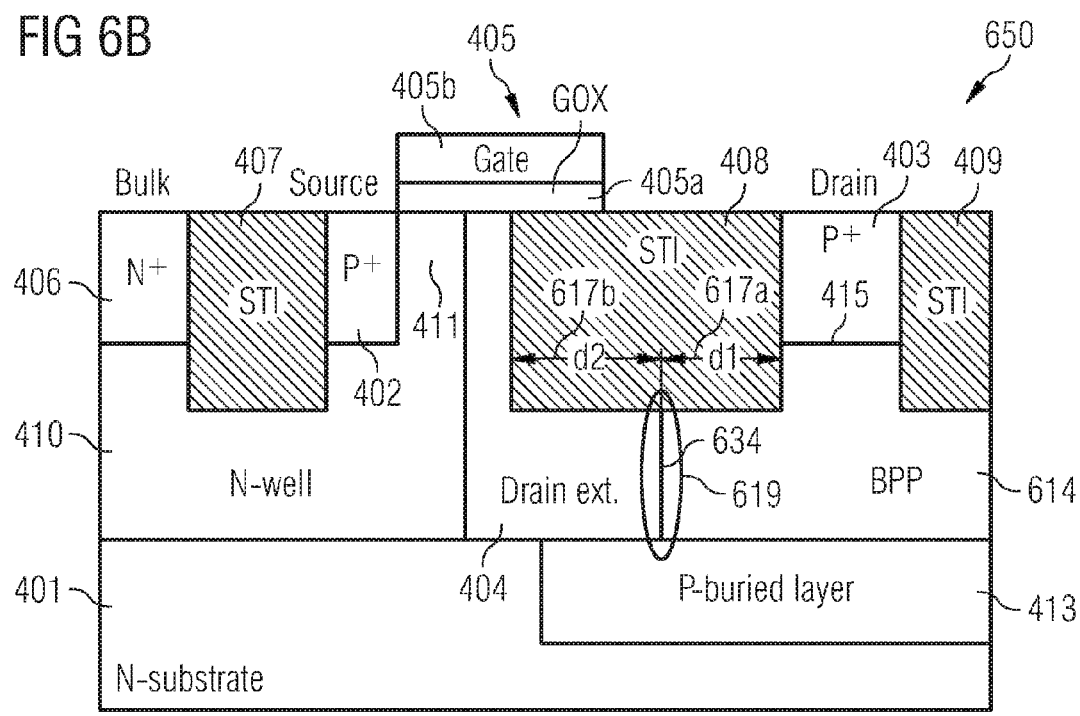

DRAIN-EXTENDED FIELD EFFECT TRANSISTOR

BACKGROUND

Though modern CMOS (complementary metal oxide semiconductor) processes are usually designed to support mainly a variety of low voltage application fields in the 1-4 V (volts) regime, there is an increasing interest in incorporating also high-voltage (HV) options into such technologies. This may allow for highly integrated products with both digital and analog/mixed signal functionalities like, for example, line drivers in telecommunications.

One relatively new class of devices used in high-voltage applications are so-called drain-extended MOS (DEMOS) devices, that is, MOS (metal oxide semiconductor) devices having a so-called drain extension.

SUMMARY OF THE INVENTION

A drain-extended field effect transistor in accordance with one embodiment of the invention includes a drain contact region and a drain extension region. The drain-extended field effect transistor further includes an electrostatic discharge protection region that is electrically connected between the drain contact region and the drain extension region to protect the drain-extended field effect transistor against electrostatic discharge. The electrostatic discharge protection region has a dopant concentration level such that in case of an electrostatic discharge event, a base push-out is prevented from reaching the drain contact region.

A drain-extended field effect transistor in accordance with another embodiment of the invention includes a drain contact region doped with a first type dopant, a drain extension region doped with the first type dopant, a well region doped with the first type dopant and electrically connected between the drain contact region and the drain extension region, and an electrostatic discharge protection region formed within at least a part of the well region and doped with the first type dopant. The dopant concentration level of the electrostatic discharge protection region is between the dopant concentration level of the drain extension region and the dopant concentration level of the drain contact region, and is higher than the dopant concentration level of the well region.

A method of fabricating a drain-extended field effect transistor in accordance with another embodiment of the invention includes forming a drain contact region, forming a drain extension region, and forming an electrostatic discharge protection region electrically connected between the drain contact region and the drain extension region to protect the drain-extended field effect transistor against electrostatic discharge. The electrostatic discharge protection region has a dopant concentration level such that in case of an electrostatic discharge event, a base push-out is prevented from reaching the drain contact region.

A drain-extended field effect transistor in accordance with another embodiment of the invention includes a base push-out prevention implantation formed within a region electrically connected between a highly doped drain implantation region and a lowly doped drain extension region of the drain-extended field effect transistor. The base push-out prevention implantation has a dopant concentration level that is between the dopant concentration level of the lowly doped drain extension region and the dopant concentration level of the highly doped drain implantation region, and is such that in case of an electrostatic discharge event, a base push-out is prevented from reaching the highly doped drain implantation region.

A method of protecting a drain-extended field effect transistor against electrostatic discharge in accordance with another embodiment of the invention includes forming an electrostatic discharge protection region in the drain-extended field effect transistor. The electrostatic discharge protection region is electrically connected between a drain contact region and a drain extension region of the drain-extended field effect transistor, and the electrostatic discharge protection region has a dopant concentration level such that in case of an electrostatic discharge event, a base push-out is prevented from reaching the drain contact region.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows a drain-extended field effect transistor;

FIG. 2 shows another drain-extended field effect transistor;

FIG. 3 shows a drain-extended field effect transistor in accordance with an embodiment of the invention;

FIG. 4A shows a drain-extended field effect transistor in accordance with another embodiment of the invention;

FIG. 4B shows a drain-extended field effect transistor in accordance with another embodiment of the invention;

FIG. 5 shows a drain-extended field effect transistor in accordance with another embodiment of the invention;

FIG. 6A shows a drain-extended field effect transistor in accordance with another embodiment of the invention;

FIG. 6B shows a drain-extended field effect transistor in accordance with another embodiment of the invention;

DETAILED DESCRIPTION OF ILLUSTRATIVE EMBODIMENTS

Figure 7:
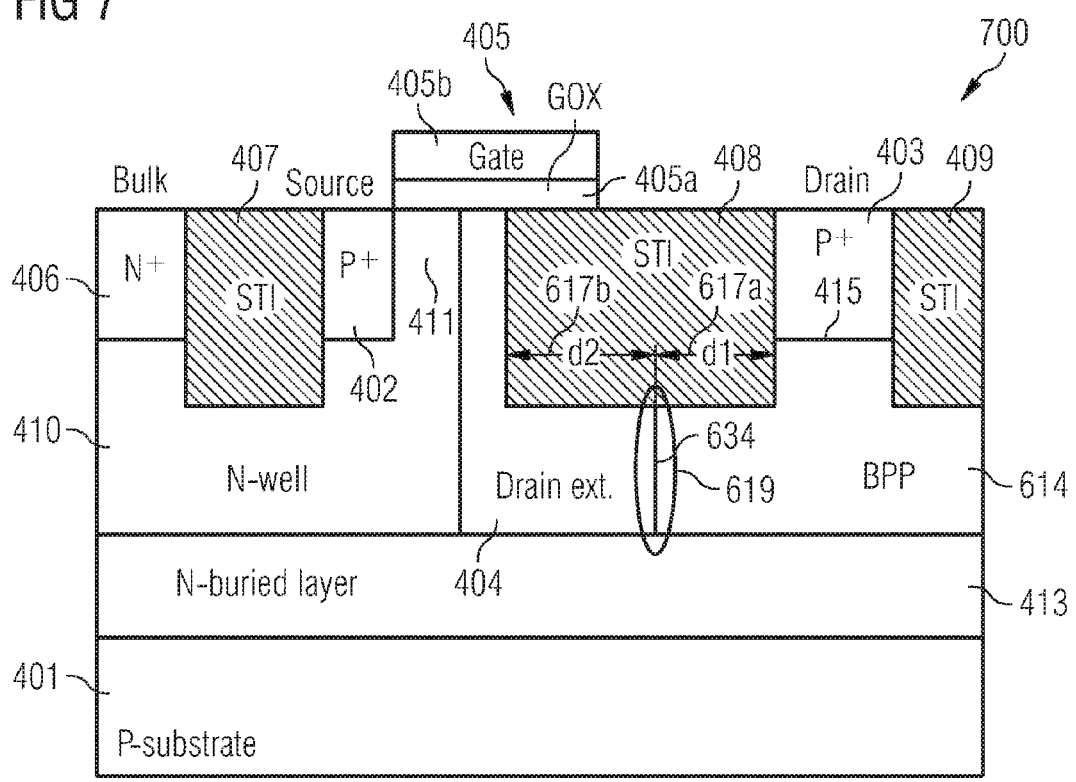
FIG. 7 shows a drain-extended field effect transistor in accordance with another embodiment of the invention.

FIG. 1 shows a schematic sectional view of a drain-extended NMOS (DE-NMOS) device 100, that is, of an n-type MOS field effect transistor having a drain extension.

The DE-NMOS 100 is built up in a p-type (p-doped) substrate 101 and includes a highly n-doped (n+ doped) source contact region 102, a highly n-doped (n+ doped) drain contact region 103, and a drain extension region 104 formed in the substrate 101. The drain extension region 104 is formed by a generic drain extension implantation, which may or may not be a conventional N-well implantation, depending, for example, on the intended operation voltage of the device. The DE-NMOS 100 further includes a gate region 105 including a gate oxide (GOX) 105a formed on the upper surface of the substrate 101, and a conductive gate layer (Gate) 105b formed on the gate oxide 105a. The DE-NMOS 100 further includes a highly p-doped (p+ doped) bulk contact region 106 which is laterally separated from the source contact region 102 by a shallow trench isolation (STI) region 107. The STI region 107 may also be left out to form a bulk contact region 106 abutting the source contact region 102. A P-well region 110 is formed in the substrate 101 and below the source contact region 102, the bulk contact region 106, the shallow trench isolation region 107, and a part of the gate region 105, wherein the P-well region 110 abuts the drain extension region 104. Alternatively, the P-well region 110 may be separated from the drain extension region 104 by the substrate 101. The P-well region 110 may, for example, be realized as a retrograde implantation that extends from the substrate surface into the substrate up to a predetermined depth.

The DE-NMOS 100 further includes a second shallow trench isolation (STI) region 108, wherein the drain contact region 103 is laterally adjacent to one side of the second shallow trench isolation region 108, and is laterally spaced apart from the gate region 105 by the second shallow trench isolation region 108. The gate region 105 partially overlaps the second shallow trench isolation region 108. The drain extension region 104 is formed in the substrate 101 under the drain contact region 103 and has a common interface with the drain contact region 103, and further extends under and around the second shallow trench isolation region 108 as far as to the upper surface of the substrate 101 adjacent to the gate region 105. In other words, the drain extension region 104 has a common interface with a part of the gate region 105, that is, with a part of the gate oxide 105a of the gate region 105. A channel region 111 is formed within the P-well region 110 under the gate region 105, and between the source contact region 102 and the drain extension region 104. The DE-NMOS 100 further includes a third shallow trench isolation (STI) region 109 that may isolate the DE-NMOS device 100 from another device formed within the substrate 101 (not shown).

Up to now, products with HV-CMOS requirements above 10 V have mainly been implemented in older technologies (e.g., a 250 nm technology) with appropriately high breakdown voltages, or have been realized with a system-in-package (SIP) approach where the low voltage part has been implemented in an advanced technology (e.g., a 130 nm technology) and where the high voltage part has been implemented, e.g., in a 250 nm technology or in a 0.35 µm technology. Both solutions may be comparatively costly.

To circumvent these cost issues, a technology add-on to advanced CMOS technologies (based, for example, on the 130 nm node) based on drain-extended MOS devices (DEMOS) may be implemented, as is shown in FIG. 2, which is a sectional view of a drain-extended NMOS (DE-NMOS) device 200, where in addition to an N-well implantation 212, two additional implantation steps, i.e., a drain extension implant 204 and an N-type buried layer implant 213, have been used to accommodate the 12-15 V operation regime. The DE-NMOS device 200 may withstand and work at voltages above 10 V with a limited process add-on (i.e., a few mask layers).

DEMOS devices such as the ones shown in FIG. 1 and FIG. 2 may generally be susceptible to a so-called base push-out or Kirk effect, which may be attributed to the low doping level of the drain extension. The terms "base push-out" or "Kirk effect" denote the effect that, when a certain current density is reached (like, for example, in a breakdown during an ESD event), the peak electric field and the maximum of avalanche generation may move from the junction between the drain extension and the P-well to the boundary between the highly doped drain (HDD) implantation region and the lowly doped drain extension. The maximum temperature may also appear at this "pseudo-junction", as TCAD (technology computer-aided design) simulations have shown. Together with the tendency to form current filaments along the width of the device local hot spots may appear. In a feed-forward loop, this may lead to even stronger local heating and melting may occur in these hot spots leading to the destruction of the device.

The above-described base push-out (Kirk effect) may involve a rather limited ESD hardness of DEMOS devices. In other words, the intrinsic ESD failure limit in DEMOS devices may be rather low. This may render the design of self-protecting ESD concepts for DEMOS devices difficult.

As DEMOS devices represent a relatively new device class, there are only a few ESD concepts at hand to protect circuits based on DEMOS devices against ESD pulses at the supply and I/O pins of a product based on this new technology variant. Known approaches are, for example, substrate pumped DEMOS devices and DEMOS based SCR (silicon controlled rectifier) devices. Both approaches try to increase the inherently limited ESD capabilities of DEMOS devices by adding additional devices/structures in the direct vicinity of a DEMOS transistor. This may either result in an SCR formed by the DEMOS itself and the additional implantations, or a second DEMOS device may be used as an auxiliary device to bring the main DEMOS device into a bipolar mode where it can carry higher amounts of current. The SCR DEMOS may be intrinsically endangered by latch-up due to a low holding voltage. This may apply especially for high supply voltages. The substrate pumped DEMOS acting as an ESD clamp relies on transients which may lead to wrong triggering (leading, for example, to operational failures) or non-triggering (ESD weak) as is known from similar concepts of substrate pumped MOSFET devices.

Both the SCR DEMOS and the substrate pumped DEMOS approach may be very area-consuming. Furthermore, both protection device types may be limited in their maximum voltage due to the gate oxides attached to the high voltage drain region.

In the following, exemplary embodiments of the invention are described and illustrated in connection with the drawings. It is noted, that the drawings are only schematic, and that the precise shapes and/or locations of individual device regions may be different from the shapes/locations shown in the figures. For example, although doped or conductive regions as well as isolating regions are generally shown as having rectangular shapes with right-angled corners and straight edges or interfaces, it will be readily understood by a person of ordinary skill in the art that one or more of the regions shown in the figures may also have a rounded or curved shape including rounded or curved edges, or that interfaces between two regions may also be rounded or curved.

FIG. 3 shows a drain-extended field effect transistor 300 in accordance with an embodiment of the invention.

The drain-extended field effect transistor 300 includes a drain contact region 303 and a drain extension region 304. Furthermore, the drain-extended field effect transistor 300 includes an electrostatic discharge protection region 314 electrically connected between the drain contact region 303 and the drain extension region 304 to protect the drain-extended field effect transistor against electrostatic discharge (ESD). The electrostatic discharge protection region 314 (ESD protection region 314) has a dopant concentration level such that in case of an electrostatic discharge event, a base push-out is prevented from reaching the drain contact region 303. In other words, the Electrostatic discharge protection region 314 is doped, wherein the dopant concentration level in the electrostatic discharge protection region 314 is such that in case of an ESD event, a base push-out is prevented from reaching the drain contact region 303.

The drain-extended field effect transistor 300 may further include a source contact region 302 and a gate region 305. The gate region 305 may include a gate-insulating layer 305a, in other words a gate dielectric (e.g., a gate oxide), and a conductive gate layer (gate) 305b formed on the gate-insulating layer 305a as shown in FIG. 3.

In accordance with an embodiment, the drain-extended field effect transistor 300 may be formed in or on a substrate 301 (e.g. a semiconductor substrate such as, for example, a silicon substrate, e.g., a silicon wafer), as is shown in FIG. 3. That is, the drain contact region 303, the drain extension region 304 and the electrostatic discharge protection region 314, and also the source contact region 302 may be formed in the substrate 301, and the gate region 305 may be formed on the substrate 301, wherein the source contact region 302 may be laterally spaced apart or separated from the drain extension region 304 by at least a channel region 311 formed in the substrate 301 under the gate region 305. The gate region 305 may overlap the channel region 311 and a part of the drain extension region 304, as shown. In other words, the gate region 305 may be formed on or above the channel region 311 and at least a part of the drain extension region 304. In this context, it is noted that although the right vertical edge of the source contact region 302 is shown to be flush with the left vertical edge of the gate region 305, it will be readily understood by a person of ordinary skill in the art that the gate region 305 may have a certain overlap with the source contact region 302 in accordance with some embodiments.

In accordance with another embodiment, the drain contact region 303, the drain extension region 304 and the electrostatic discharge protection region 314 may be doped with a first type dopant, wherein the dopant concentration level of the drain contact region 303 is higher than the dopant concentration level of the drain extension region 304, and wherein the dopant concentration level of the electrostatic discharge protection region 314 is between the dopant concentration level of the drain extension region 304 and the dopant concentration level of the drain contact region 303.

In accordance with an embodiment, the first type dopant may be an n-type dopant such as, for example, arsenic (As) or phosphorous (P), e.g., in case that the drain-extended field effect transistor 300 is configured as an n-type drain-extended field effect transistor, for example, as an DE-NMOS field effect transistor.

In accordance with another embodiment, the first type dopant may be a p-type dopant such as, for example, boron (B), e.g., in case that the drain-extended field effect transistor 300 is configured as a p-type drain-extended field effect transistor, for example, as a DE-PMOS field effect transistor.

In accordance with another embodiment, the substrate 301 may be doped with a second type dopant that is different from the first type dopant. For example, the second type dopant may be a p-type dopant such as, for example, boron (B) in case that the first type dopant is an n-type dopant, and the second type dopant may be an n-type dopant such as, for example, arsenic (As) or phosphorous (P) in case that the first type dopant is a p-type dopant. In accordance with an alternative embodiment, the substrate 301 may be doped with the first type dopant.

In accordance with some embodiments, the dopant concentration level of the substrate 301 may be in the range from about $10^{14}$ cm$^{-3}$ to about $10^{16}$ cm$^{-3}$, for example, in the range from about $5 \times 10^{14}$ cm$^{-3}$ to about $5 \times 10^{15}$ cm$^{-3}$ in accordance with one embodiment, e.g., $10^{15}$ cm$^{-3}$ in one embodiment.

In accordance with another embodiment, the drain-extended field effect transistor 300 may further include a well region (not shown in FIG. 3, see, e.g., FIG. 4A) electrically connected between the drain contact region 303 and the drain extension region 304 and doped with the first type dopant, wherein the electrostatic discharge protection region 314 is formed within at least a part of the well region, and wherein the dopant concentration level of the well region is between the dopant concentration level of the drain extension region 304 and the dopant concentration level of the electrostatic discharge protection region 314. In other words, in accordance with an embodiment, the electrostatic discharge protection region 314 may be formed within a portion of the well region and may have a higher doping concentration than the well region.

In accordance with some embodiments, the dopant concentration level of the drain extension region 304 may be in the range from about $5 \times 10^{16}$ cm$^{-3}$ to about $5 \times 10^{17}$ cm$^{-3}$, for example, in the range from about $7 \times 10^{16}$ cm$^{-3}$ to about $3 \times 10^{17}$ cm$^{-3}$ in accordance with one embodiment, e.g., about $10^{17}$ cm$^{-3}$ in one embodiment. In accordance with one embodiment, the doping of the drain extension region 304 may be achieved by means of one or more implantations.

In accordance with some embodiments, the dopant concentration level of the well region may be in the range from about $10^{17}$ cm$^{-3}$ to about $10^{19}$ cm$^{-3}$, for example, in the range from about $5 \times 10^{17}$ cm$^{-3}$ to about $5 \times 10^{3}$ cm$^{-3}$ in accordance with one embodiment, e.g., about $10^{18}$ cm$^{-3}$ in one embodiment. In accordance with one embodiment, the well region may be configured as a retrograde well, in other words, as a well region having a retrograde doping, i.e., a dopant concentration that increases with increasing depth into the substrate. To put it in still other words, the well region may have a vertical doping gradient.

In accordance with some embodiments, the dopant concentration level of the electrostatic discharge protection region 314 may be in the range from about $10^{19}$ cm$^{-3}$ to about $10^{20}$ cm$^{-3}$, for example, in the range from about $3 \times 10^{19}$ cm$^{-3}$ to about $7 \times 10^{9}$ cm$^{-3}$ in accordance with one embodiment, e.g., about $5 \times 10^{19}$ cm$^{-3}$ in one embodiment.

In accordance with some embodiments, the dopant concentration level of the drain contact region 303 may be in the range from about $5 \times 10^{19}$ cm$^{-3}$ to about $10^{21}$ cm$^{-3}$, for example, in the range from about $10^{20}$ cm$^{-3}$ to about $5 \times 10^{20}$ cm$^{-3}$ in accordance with one embodiment, e.g., about $2 \times 10^{20}$ cm$^{-3}$ in one embodiment.

In accordance with another embodiment, the drain-extended field effect transistor 300 may further include a bulk contact region (not shown in FIG. 3, see, e.g., FIG. 4A) formed in the substrate 301 and laterally separated from the source contact region by a shallow trench isolation (STI) region. In accordance with an alternative embodiment, the shallow trench isolation region may be omitted such that the bulk contact region is laterally adjacent to the source contact region. The bulk contact region may serve as an electrical bulk contact or substrate contact of the transistor 300.

The bulk contact region may be doped with the second type dopant and may have a similar dopant concentration level as the drain contact region and/or the source contact region.

In accordance with another embodiment, the drain-extended field effect transistor 300 may further include a well region (not shown in FIG. 3, see, e.g., FIG. 4A) doped with the second type dopant and formed in the substrate 301 under at least one of the source contact region 302, the bulk contact region and the shallow trench isolation region. The well region may also be formed under a part of the gate region 305 and may abut the drain extension region 304. For example, the well region may be formed under a part of the gate region 305 that is not formed on the drain extension region 304, such that the channel region 311 may be formed in the well region. In accordance with an alternative embodiment, the well region may be separated from the drain extension region 304 by the substrate 301. In accordance with one embodiment, the well region may be realized as a retrograde implantation that extends from the substrate surface into the substrate up to a predetermined depth.

In accordance with another embodiment, the drain-extended field effect transistor 300 may further include a second shallow trench isolation region (not shown in FIG. 3, see, e.g., FIG. 4A), wherein the drain contact region 303 is formed laterally adjacent to the second shallow trench isolation region, and wherein a portion of the electrostatic discharge protection region 314 that is distal from the drain contact region 303 (in other words, a portion of the electrostatic discharge protection region 314 that does not face or abut the drain contact region 303, or, in still other words, that is located away from an interface between the electrostatic discharge protection region 314 and the drain contact region 303) extends under the second shallow trench isolation region.

In accordance with another embodiment, the drain-extended field effect transistor 300 may further include a buried layer (not shown in FIG. 3, see, e.g., FIG. 4A) doped with the first type dopant and formed under and electrically connected to at least one of the drain extension region 304 and the electrostatic discharge protection region 314. In case that the buried layer is n-doped, the buried layer may also be referred to as a deep N-band.

In accordance with some embodiments, the dopant concentration level of the buried layer may be in the range from about $5 \times 10^{16}$ cm$^{-3}$ to about $10^{18}$ cm$^{-3}$, for example, in the range from about $10^{17}$ cm$^{-3}$ to about $5 \times 10^{17}$ cm$^{-3}$ in accordance with one embodiment, e.g., about $2 \times 10^{17}$ cm$^{-3}$ in one embodiment.

In accordance with another embodiment, the source contact region 302 may be doped with the first type dopant. In accordance with one embodiment, the dopant concentration level of the source contact region 302 may be similar to the dopant concentration level of the drain contact region 303. For example, in accordance with some embodiments, the dopant concentration level of the source contact region 302 may be in the range from about $5 \times 10^{19}$ cm$^{-3}$ to about $10^{21}$ cm$^{-3}$, for example, in the range from about $10^{20}$ cm$^{-3}$ to about $5 \times 10^{20}$ cm$^{-3}$ in accordance with one embodiment, e.g. about $2 \times 10^{20}$ cm$^{-3}$ in one embodiment.

In accordance with another embodiment, the channel region 311 may be doped with the second type dopant. In accordance with another embodiment, the channel region 311 may have a similar dopant concentration level as the substrate 301.

Figure 8:
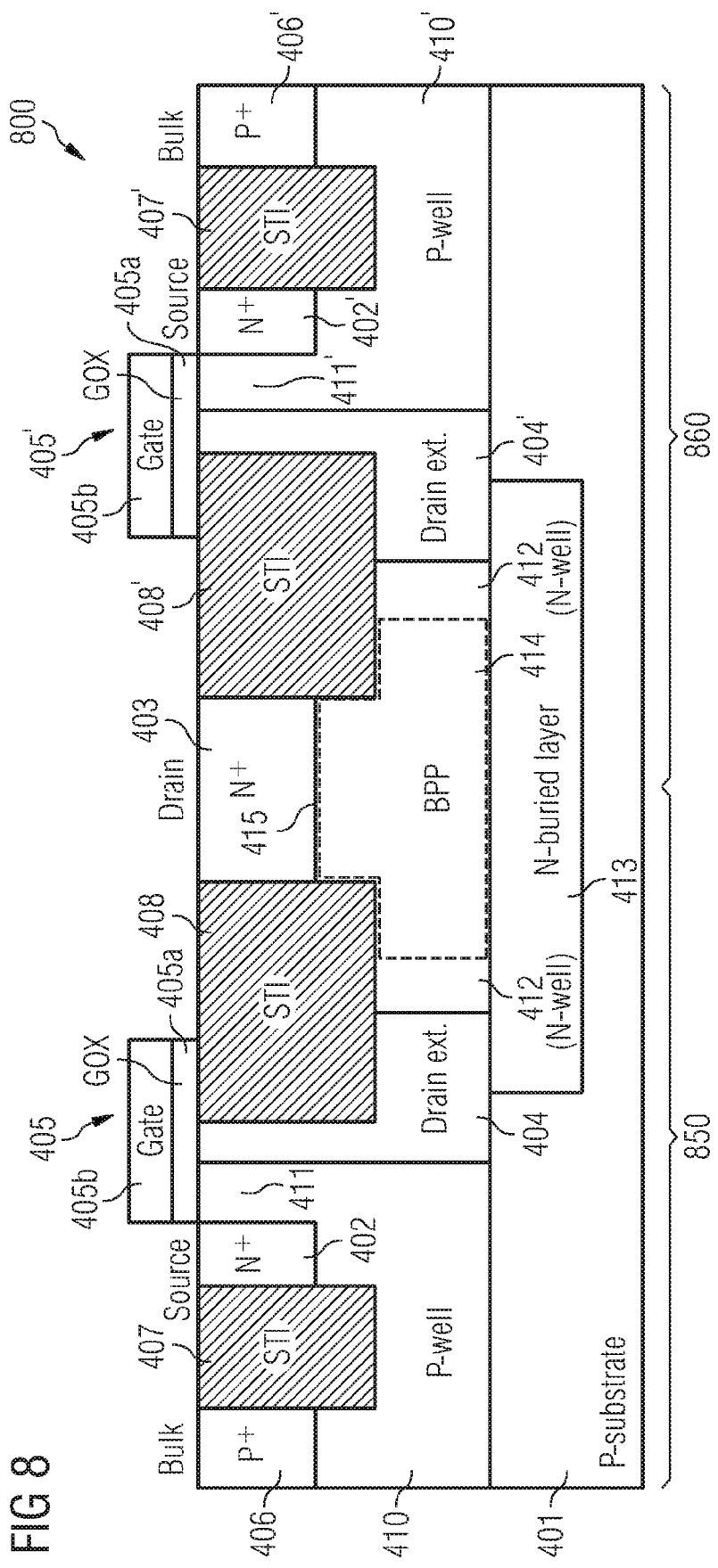
FIG. 8 shows a drain-extended field effect transistor in accordance with another embodiment of the invention.

In accordance with another embodiment, the drain-extended field effect transistor 300 may have a mirror-symmetrical structure relative to the drain contact region 303, comprising a second drain extension region located mirror-symmetrically to the drain extension region, wherein the electrostatic discharge protection region 304 is further electrically connected between the drain contact region 303 and the second drain extension region (not shown in FIG. 3, see, e.g., FIG. 8).

In accordance with another embodiment, the drain-extended field effect transistor 300 may include a diffusion region (not shown in FIG. 3, see FIG. 10) doped with the first type dopant and formed between the source contact region 302 and the drain extension region 304, wherein the channel region includes first and second channel sub-regions separated from one another by the diffusion region, wherein the gate region 305 includes first and second gate sub-regions (not shown in FIG. 3, see FIG. 10) separated from one another, and wherein the first gate sub-region is formed on or above the first channel sub-region and the second gate sub-region is formed on or above the second channel sub-region and at least a part of the drain extension region 304. Clearly, the first channel sub-region may be disposed between the source contact region 302 and the diffusion region, and the second channel sub-region may be disposed between the diffusion region and the drain extension region 304.

FIG. 4A shows a drain-extended field effect transistor 400 in accordance with another embodiment of the invention.

The drain-extended field effect transistor 400 includes a drain contact region 403 doped with a first type dopant, a drain extension region 404 doped with the first type dopant, a well region 412 doped with the first type dopant and electrically connected between the drain contact region 403 and the drain extension region 404, and an electrostatic discharge protection region 414 formed within a part of the well region 412 (indicated by the dashed line) and doped with the first type dopant. The dopant concentration level of the electrostatic discharge protection region 414 is between the dopant concentration level of the drain extension region 404 and the dopant concentration level of the drain contact region 403, and is higher than the dopant concentration level of the well region 412.

Clearly, the drain-extended field effect transistor 400 is configured as a DE-NMOS device that includes highly n-doped (n+ doped) source contact regions 402 and drain contact regions 403 formed in a p-doped substrate (P-substrate) 401. The substrate 401 may, for example, be a semiconductor substrate such as, e.g., a silicon substrate. The dopant concentration level of the source and drain contact regions 402, 403 may be as described above in connection with the embodiment of FIG. 3, and may, for example, be achieved by means of a source/drain or HDD implantation. Furthermore, the dopant concentration level of the substrate 401 may be as described above in connection with the embodiment of FIG. 3.

The DE-NMOS 400 further includes a highly p-doped (p+ doped) bulk contact region 406 formed in the substrate 401 and laterally separated from the source contact region 402 by a shallow trench isolation (STI) region 407. In accordance with an alternative embodiment, the shallow trench isolation region 407 may be omitted such that the bulk contact region 406 is laterally adjacent to the source contact region 402. The bulk contact region 406 may serve as an electrical bulk or substrate contact of the transistor 400 and may have a similar dopant concentration level as the source and drain contact regions 402, 403.

The DE-NMOS 400 includes an n-doped well region (N-well) 412 that is formed under the drain contact region 403 and extends under a second shallow trench isolation (STI) region 408 formed in the substrate 401 and adjacent to a first side of the drain contact region 403, the first side facing the source contact region 402, and further extends under a third shallow trench isolation (STI) region 409 formed in the substrate 401 and adjacent to a second side of the drain contact region 403, the second side being opposite the first side.

The well region 412 may, for example, be formed by means of a well implantation, using, e.g., arsenic (As), phosphorous (P) or other suitable n-type dopants as implants, and may have a dopant concentration level in the range from about $10^{17}$ cm$^{-3}$ to about $10^{19}$ cm$^{-3}$, for example, in the range from about $5 \times 10^{17}$ cm$^{-3}$ to about $5 \times 10^{18}$ cm$^{-3}$, e.g. about $10^{18}$ cm$^{-3}$. The well region 412 has a common interface 415 with the drain contact region 403. In other words, the well region 412 abuts a lower boundary of the drain contact region 403. Furthermore, the well region 412 has a common interface 416 with the drain extension region 404. In other words, the well region 412 abuts a vertical boundary of the drain extension region 404 formed below the second shallow trench isolation region 408.

Clearly, the drain contact region 403 is laterally electrically isolated by means of the second and third shallow trench isolation regions 408, 409 which may extend deeper into the substrate 401 than the drain contact region 403. Analogously, the source contact region 402 and the bulk contact region 406 are laterally electrically isolated from one another by means of the shallow trench isolation region 407 which may extend deeper into the substrate 401 than the source and bulk contact regions 402, 406.

The vertical and/or lateral dimensions of the contact regions 402, 403, 406 and of the shallow trench isolation regions 407, 408, 409 may be determined by the process technology (e.g., CMOS technology) used for manufacturing the transistor 400. In this context, the lateral extension of a region is understood to refer to the extension of that region in the direction parallel to the substrate surface or main processing surface, while the vertical extension or depth of a region is understood to refer to the extension of that region in the direction perpendicular to the substrate surface or main processing surface. For example, the term "the depth of region A is in the range from 0 to about x nm" is understood to mean that region A extends from the substrate surface (zero level) up to about x nm deep into the substrate, while the term "the depth of region B is in the range from about y μm to about z μm" is understood to mean that region B extends from a depth of about y μm (in the substrate) up to a depth of about z μm (in the substrate), wherein x, y, z are non-negative real numbers and y<z.

In accordance with some embodiments, the depth of at least one of the contact regions 402, 403, and 406 may be in the range from 0 to about 250 nm, although at least one of the regions 402, 403, and 406 may have a different depth. For example, at least one of the regions 402, 403, 406 may have a smaller vertical extension. Clearly, the contact regions 402, 403, and 406 may be configured as shallow implants in accordance with one embodiment.

In accordance with some embodiments, the depth of at least one of the STI regions 407, 408, 409 may be in the range from 0 to about 750 nm, for example in the range from 0 to about 500 nm in accordance with one embodiment, e.g., in the range from 0 to about 200 nm in one embodiment.

The DE-NMOS 400 includes a drain extension region 404 that is formed under the second shallow trench isolation region 408 and also adjacent to a side of the second shallow trench isolation region 408 that faces the source contact region 402. The drain extension region 404 may, for example, be formed by means of an extension implantation (drain extension implant), using, e.g., arsenic (As), phosphorous (P) or other suitable n-type dopants as implants. The drain extension region 404 may have a dopant concentration level as described above in connection with the embodiment of FIG. 3.

Clearly, the drain extension region 404 extends from the common interface 416 with the well region 412 around the lower-left corner of the second shallow trench isolation region 408 and up to the substrate surface under a gate region 405 of the transistor 400, wherein the drain extension region 404 is separated from the source contact region 402 by the substrate 401 and by the channel region 411.

Clearly, the drain extension region 404 extends deeper into the substrate 401 than the second shallow trench isolation region 408. The depth (or vertical extension in the substrate) of the drain extension region 404 may be determined by the process technology (e.g., CMOS technology) used for manufacturing the transistor 400. In accordance with some embodiments, the depth of the drain extension region 404 may be in the range from 0 to about 1.5 μm, for example, in the range from 0 to about 1 μm in accordance with one embodiment, e.g., in the range from 0 to about 0.5 μm in one embodiment, although the drain extension region 404 may have a different depth.

In accordance with another embodiment, the well region 412 may have about the same depth as the drain extension region 404. In other words, a lower boundary of the drain extension region 404 may be about flush with a lower boundary of the well region 412 as shown in FIG. 4A.

In accordance with an alternative embodiment, the well region 412 may have a different depth than the drain extension region 404. For example, in one embodiment, the well region 412 may extend deeper into the substrate 401 than the drain extension region 404.

The DE-NMOS 400 further includes an n-doped buried layer (N-buried layer) 413 formed below the well region 412 and a part of the drain extension region 404, and electrically connected to the well region 412 and to the drain extension region 404. The N-buried layer 413 may also be referred to as a deep N-band. As shown in FIG. 4A, the buried layer 413 abuts both the drain extension region 404 and the well region 412. In accordance with an alternative embodiment, for example, in case that the well region 412 extends deeper into the substrate 401 than the drain extension region 404, the buried layer 413 may be separated from the drain extension region 404 by the substrate 401. In other words, in this case the buried layer 413 may be connected to the drain extension region 404 only indirectly via the well region 412. In accordance with an alternative embodiment, the buried layer 413 may extend laterally under the whole DE-NMOS 400. The buried layer 413 may, for example, extend laterally up to an adjacent N-well contact region or an adjacent DE-NMOS placed to the left or the right of the DE-NMOS 400 (adjacent elements not shown in FIG. 4A). The buried layer 413 may, for example, be formed by means of a suitable implantation, using, e.g., arsenic (As), phosphorous (P) or other suitable n-type dopants as implants.

In accordance with some embodiments, the buried layer 413 may have a dopant concentration level in the range from about $5 \times 10^{16}$ cm$^{-3}$ to about $10^{18}$ cm$^{-3}$, for example in the range from about $10^{17}$ cm$^{-3}$ to about $5 \times 10^{17}$ cm$^{-3}$ in accordance with one embodiment, e.g., about $2 \times 10^{17}$ cm$^{-3}$ in one embodiment.

The buried layer 413 shown in FIG. 4A is an optional layer, which may be omitted in accordance with alternative embodiments.

In accordance with one embodiment, the depth of the buried layer 413 may be in the range from about 0.8 μm to about 2 μm. In other words, the buried layer 413 may extend from a depth of about 0.8 μm (in the substrate 401) to a depth of about 2 μm (in the substrate 401). To put it in still other words, an upper boundary of the buried layer 413 may be located at a depth of about 0.8 μm in the substrate 401, and a lower boundary of the buried layer 413 may be located at a depth of about 2 μm in the substrate 401. In accordance with alternative embodiments, though, the depth or vertical extension of the buried layer 413 may have a different value. For example, in accordance with one embodiment the buried layer 413 may have a smaller vertical extension.

The DE-NMOS 400 further includes a p-doped well region (P-well) 410 that is formed in the substrate 401 and under the source contact region 402, the bulk contact region 406, the shallow trench isolation region 407, and a part of the gate region 405, wherein the well region 410 abuts the drain extension region 404. In accordance with another embodiment, the well region 410 may be separated from the drain extension region 404 by the substrate 401.

The well region 410 may, for example, be formed by means of a well implantation, using, e.g., boron (B) as dopant implant, and may have, for example, a dopant concentration level in the range from about $10^{17}$ cm$^{-3}$ to about $10^{19}$ cm$^{-3}$, for example, in the range from about $5\times10^{17}$ cm$^{-3}$ to about $5\times10^{18}$ cm$^{-3}$, e.g. about $10^{18}$ cm$^{-3}$. The depth of the well region 410 in the substrate 401 and the dimensions of the well region 410 may, for example, be determined by the process technology (e.g., CMOS technology) used for manufacturing the transistor 400. In accordance with some embodiments, the depth of the well region 410 may be in the range from 0 to about 1.5 µm, for example, in the range from 0 to about 1 µm in accordance with one embodiment, e.g., in the range from 0 to about 0.5 µm in one embodiment, although the well region 410 may have a different depth.

Clearly, the DE-NMOS 400 includes an n-doped electrostatic discharge protection region 414 (ESD protection region 414) that is formed within a part of the n-doped well region 412, the part of the well region 412 being indicated by the dashed line in FIG. 4A. In accordance with an embodiment, the electrostatic discharge protection region 414 may have a similar depth as the well region 412. In other words, a lower boundary of the electrostatic discharge protection region 414 may be about flush with the lower boundary of the well region 412. For example, in accordance with one embodiment, the electrostatic discharge protection region may have a depth of about 1 µm, that is, the lower boundary of the electrostatic discharge protection region 414 is located about 1 µm deep in the substrate 401, although in accordance with other embodiments, the electrostatic discharge protection region 414 have a different depth.

In accordance with some embodiments, the dopant concentration level of the electrostatic discharge protection region 414 may be in the range from about $10^{19}$ cm$^{-3}$ to about $10^{20}$ cm$^{-3}$, for example, in the range from about $3\times10^{19}$ cm$^{-3}$ to about $7\times10^{19}$ cm$^{-3}$ in accordance with one embodiment, e.g., about $5\times10^{19}$ cm$^{-3}$ in one embodiment.

A portion of the electrostatic discharge protection region 414 that is distal from the drain contact region 403 (in other words, a portion of the electrostatic discharge protection region 414 that does not face or abut the drain contact region 403, or, in still other words, a portion that is located away from the interface 415) extends under the second shallow trench isolation region 408.

Clearly, the electrostatic discharge protection region 414 extends from the interface 415 with the drain contact region 403 around the lower-right corner of the second shallow trench isolation region 408, and further extends a distance d (denoted by the double arrow 417) under the second shallow trench isolation 408. In other words, the electrostatic discharge protection region 414 abuts the drain contact region 403 at the location of the interface 415 between the well region 412 and the drain contact region 403, and has another interface 418 located under the second shallow trench isolation region 408 and at a lateral distance d away from that side of the second shallow trench isolation region 408 that faces the drain contact region 403. The interface 418 is located inside the well region 412 and may be approximately perpendicular to the substrate surface. In accordance with one embodiment, the distance d may have a value of approximately greater than or equal to 30 nm. In general, the value of d may be such that the electrostatic discharge protection region 414 extends well under the second shallow trench isolation region 408.

As shown in FIG. 4A, the electrostatic discharge protection region 414 may also extend under the third shallow trench isolation region 409.

In accordance with an embodiment, the electrostatic discharge protection region 414 may be formed by means of an implantation, using, e.g., arsenic (As), phosphorous (P) or other suitable n-type dopants as implants.

The DE-NMOS 400 further includes a gate region 405 that includes a gate-insulating layer 405a (e.g., a gate oxide (GOX) as shown) and a conductive gate layer (Gate) 405b formed on the gate-insulating layer 405a. The gate region 405 is formed on the channel region 411 as well as on that part of the drain extension region 404 that extends towards the substrate surface. Furthermore, the gate region 405 may partially overlap the second shallow trench isolation region 408 as is shown in FIG. 4A. The gate region 405 may be formed in a known manner.

In accordance with the embodiment shown in FIG. 4A, an additional implantation (also referred to as "new ESD implant") is used to prevent a base push-out effect to snapback to the N+/N–well (N+=HDD) junction. By means of this implantation, the electrostatic discharge protection region 414 is formed. The implantation is also referred to as "base push-out prevention implant" or, short, "BPP implant". The additional implantation is of the same type as the drain extension 404 but has a higher doping level.

In accordance with an embodiment, the base push-out prevention (BPP) implant may embed the highly doped drain (HDD) and may overlap the STI border of the HDD significantly. The doping level of the electrostatic discharge protection region 414 may be properly adjusted, such that a base push-out only leads to a shift of the maximum avalanche generation away from the drain extension/p-well junction to the junction 418 of the BPP implant 414. This is illustrated by the ellipse 419 in FIG. 4A, which indicates the region of maximum electric field and avalanche generation after a base bush-out event. The maximum temperature spot will be located near the area 419, so that it is deeper in the silicon.

It can be seen that in the drain-extended field effect transistor 400, a base push-out is prevented from reaching the drain contact region 403. Furthermore, as the current flows under the STI 408, a certain ballasting resistance may be maintained along the path to the contact. This may limit the capability of the device 400 to form narrow current filaments. Thus, the DE-NMOS 400 exhibits a strongly improved ESD robustness.

Clearly, the drain-extended field effect transistor 400 shown in FIG. 4A is configured as a DE-NMOS device including an additional base-pushout prevention (BPP) implantation. The BPP implant covers the whole drain HDD region and extends under the STI. The left edge of the BPP implant may be located between the left edge of the N-well and the right edge of the N-well.

In accordance with one embodiment, the BPP implant may be integrated before the n-well implantation. In accordance with another embodiment, the BPP implant may be integrated after the n-well implantation, e.g., directly after the n-well implantation. In accordance with another embodiment, the BPP implant may be integrated before the HDD implantation.

FIG. 4B shows a drain-extended field effect transistor 450 in accordance with another embodiment of the invention. The drain-extended field effect transistor 450 has a similar structure as the drain-extended field effect transistor 400 shown in FIG. 4A, except that the doping types of all doped regions are reversed. That is, in accordance with this embodiment n-doped regions have become p-doped regions and vice versa. Thus, the drain-extended field effect transistor 450 clearly is configured as a DE-PMOS device, that is, as a p-type drain-extended MOS field effect transistor.

In accordance with the embodiments shown in FIG. 4A and FIG. 4B, two interfaces 416 and 418 are located below the second shallow trench isolation region 408, wherein the interfaces 416, 418 in each case delineate regions with different dopant concentration levels, wherein the dopant concentration levels increase from left to right (i.e., from the drain extension region 404 towards the electrostatic discharge protection region 414), as described above. Although the interfaces 416, 418 as drawn might suggest a stepwise or discrete increase in the dopant concentration level, it is noted that in accordance with some embodiments the increase in the dopant concentration level from left to right may occur in a gradual or continuous manner.

FIG. 5 shows a drain-extended field effect transistor 500 in accordance with another embodiment of the invention.

The drain-extended field effect transistor 500 is configured as a DE-PMOS device and differs from the DE-PMOS 450 of FIG. 4B in that the buried layer 413 is configured as an n-doped buried layer that is formed within a p-doped substrate 401 and extends under the whole DE-PMOS 500, that is, under the well region 410 (N-well), the drain extension region 404, and the well region 412 (P-well). Thus, the DE-PMOS 500 is formed in or above a p-doped substrate in contrast to the DE-PMOS 450 that is formed in or on an n-doped substrate.

Clearly, the DE-PMOS 500 may be obtained from the DE-NMOS 400 of FIG. 4A by inverting the doping types of the well regions 410, 412, the drain extension region 404, the BPP implant 414, and the contact regions 402, 403, 406, and providing a deep n-band under the p-well implant at the drain. Thus, the PMOS drain may be electrically isolated against the substrate, which is also p-doped.

FIG. 6A shows a drain-extended field effect transistor 600 in accordance with another embodiment of the invention.

The drain-extended field effect transistor 600 is configured as a DE-NMOS device and differs from the DE-NMOS 400 of FIG. 4A in that the DE-NMOS 600 includes a base push-out prevention (BPP) implantation 614 (in other words, an electrostatic discharge protection region 614 (ESD protection region 614)) but no N-well implantation. In other words, in accordance with this embodiment, a standard CMOS N-well implant is left out and a new ESD or BPP implant (having a higher doping concentration than the standard well implant) is integrated in the DE-NMOS device 600.

In accordance with one embodiment, the N-well implant may be used as the BPP implant which may reduce the number of processing steps in manufacturing the device. In other words, an N-well implantation, which may be part of a standard CMOS process flow, may be adapted or modified such that it may be used as the BPP implantation.

Clearly, in the DE-NMOS 600, a standard N-well implant is replaced by a new ESD implant or BPP implant 614 having a higher dopant concentration level than the N-well implant. The BPP implant 614 has a common interface 634 with the drain extension 404 of the transistor 600, the interface 634 being located under the second shallow trench isolation 408. By means of the BPP implant 614, the device 600 may be prevented from strong base push-out in case that high current densities occur, as the region of maximum electric field and avalanche generation may be shifted to the interface 634 between the drain extension region 404 and the BPP implant 614. Thus, the maximum temperature spot will also be located in this area and thus deeper in the substrate 401, as is indicated by the ellipse 619 in FIG. 6A.

In accordance with some embodiments, the BPP implant 614 may be formed such that the interface 634 is sufficiently far away from the vertical edges of the second shallow trench isolation region 408. For example, in accordance with one embodiment, the electrostatic discharge protection region 614 (or BPP implant 614) may be formed such that the interface 634 between the electrostatic discharge protection region 614 and the drain extension region 404 is laterally spaced apart from the right edge (that is, the edge facing the drain contact region 403) of the second shallow trench isolation region 408 by a distance d1 (indicated by the double arrow 617a in FIG. 6A), wherein d1 may be equal to or greater than approximately 30 nm in accordance with an embodiment. Furthermore, the electrostatic discharge protection region 614 may be formed such that the interface 634 is laterally spaced apart from the left edge (that is, the edge facing the source contact region 402) of the second shallow trench isolation region 408 by a distance d2 (indicated by the double arrow 617b in FIG. 6A), wherein d2 may be equal to or greater than approximately 30 nm in accordance with an embodiment. In accordance with another embodiment, the value of at least one of the distances d1 and d2 may be determined by the process technology (e.g., CMOS technology) used for manufacturing the device 600.

FIG. 6B shows a drain-extended field effect transistor 650 in accordance with another embodiment of the invention. The drain-extended field effect transistor 650 has a similar structure as the drain-extended field effect transistor 600 shown in FIG. 6A, except that the doping types of all doped regions are reversed. That is, in accordance with this embodiment n-doped regions have become p-doped regions and vice versa. Thus, the drain-extended field effect transistor 650 clearly is configured as a DE-PMOS device, that is, as a p-type drain-extended MOS field effect transistor.

In the embodiments shown in FIG. 6A and FIG. 6B, the interface 634 delineates two regions with different dopant concentration levels, namely the drain extension region 404 and the electrostatic discharge protection region 614, wherein the dopant concentration level of the electrostatic discharge protection region 614 is higher than the dopant concentration level of the drain extension region 404. As described above in connection with the embodiments of FIG. 4A and FIG. 4B, although the interface 634 as drawn might suggest a stepwise or discrete increase in the dopant concentration level, it is noted that in accordance with some embodiments the increase in the dopant concentration level from left to right may occur in a gradual or continuous manner.

FIG. 7 shows a drain-extended field effect transistor 700 in accordance with another embodiment of the invention.

The drain-extended field effect transistor 700 is configured as a DE-PMOS device and differs from the DE-PMOS 650 of FIG. 6B in that the buried layer 413 is configured as an n-doped buried layer that is formed within a p-doped substrate 401 and extends under the whole DE-PMOS 700, that is, under the well region 410 (N-well), the drain extension region 404, and the electrostatic discharge protection region 414. Thus, the DE-PMOS 700 is formed in or above a p-doped substrate in contrast to the DE-PMOS 650 that is formed in or on an n-doped substrate.

Clearly, the DE-PMOS 700 may be obtained from the DE-NMOS 600 of FIG. 6A by inverting the doping types of the well region 410, the drain extension region 404, the BPP implant 414, and the contact regions 402, 403, 406, and providing a deep N-band under the BPP implant at the drain. Thus, the PMOS drain may be electrically isolated against the substrate, which is also p-doped.

FIG. 8 shows a drain-extended field effect transistor 800 in accordance with another embodiment of the invention. The drain-extended field effect transistor 800 is configured as a DE-NMOS device and has a "folded" layout. Clearly, the drain-extended field effect transistor 800 may be obtained by mirroring the device of FIG. 4A to the right in such a way that the symmetry axis intersects the drain contact region 403. The obtained DE-NMOS device 800 has two device "fingers" 850 and 860, wherein a first device finger 850 corresponds to the device structure shown in FIG. 4A and a second device finger 860 corresponds to the mirrored device structure.

The DE-NMOS 800 includes a second drain extension region 404' located mirror-symmetrically to the drain extension region 404. Furthermore, the electrostatic discharge protection region 414 is further electrically connected between the drain contact region 403 and the second drain extension region 404' as is shown in FIG. 8.

Furthermore, the DE-NMOS 800 (or, more precisely, the second device finger 860 thereof) includes a second source contact region 402', a second gate region 405', a second bulk contact region 406', a second p-doped well region 410', and a second channel region 411', wherein all aforementioned regions are located mirror-symmetrically to their respective counterparts in the first device finger 850.

Furthermore, the DE-NMOS 800 includes a fourth shallow trench isolation region 407' located mirror-symmetrically to the shallow trench isolation region 407, and a fifth shallow trench isolation region 408' located mirror-symmetrically to the second shallow trench isolation region 408. It is noted that the third shallow trench isolation region 409 of the DE-NMOS 400 of FIG. 4A is not present in the DE-NMOS 800 of FIG. 8. The electrostatic discharge protection region 414 (BPP implant) extends under the second shallow trench isolation region 408 and also under the fifth shallow trench isolation region 408', and the (optional) n-doped buried layer 413 is formed under and electrically connected to the drain extension regions 404, 404', and the n-doped well region 412 (and the electrostatic discharge protection region 414 formed therein).

The first and second device fingers 850, 860 of the DE-NMOS 800 may be configured, for example, in accordance with one or more embodiments described above in connection with FIG. 4A.

Clearly, FIG. 8 shows a DE-NMOS device with a new ESD (or BPP) implant extending from the left to the right drain extension area and covering the whole drain n+ area (=HDD).

In accordance with another embodiment (not shown), the doping types of all doped regions in FIG. 8 may be reversed. That is, in accordance with this embodiment, all n-doped regions of the transistor 800 become p-doped regions and vice versa such that a DE-PMOS device is obtained as described above in connection with FIG. 4B. In other words, a DE-PMOS device may be obtained by mirroring the device of FIG. 4B to the right in a similar manner as described above in connection with FIG. 8.

The DE-PMOS device obtained in the above-mentioned way would be formed in or on an n-type substrate. In accordance with another embodiment, a DE-PMOS device that is formed in or on a p-type substrate may, for example, be obtained by inverting the doping types of all doped regions but the substrate, and forming a deep N-band in the p-substrate, e.g., in a similar manner as described above in connection with the embodiments shown in FIG. 5 and FIG. 7.

Figure 9:
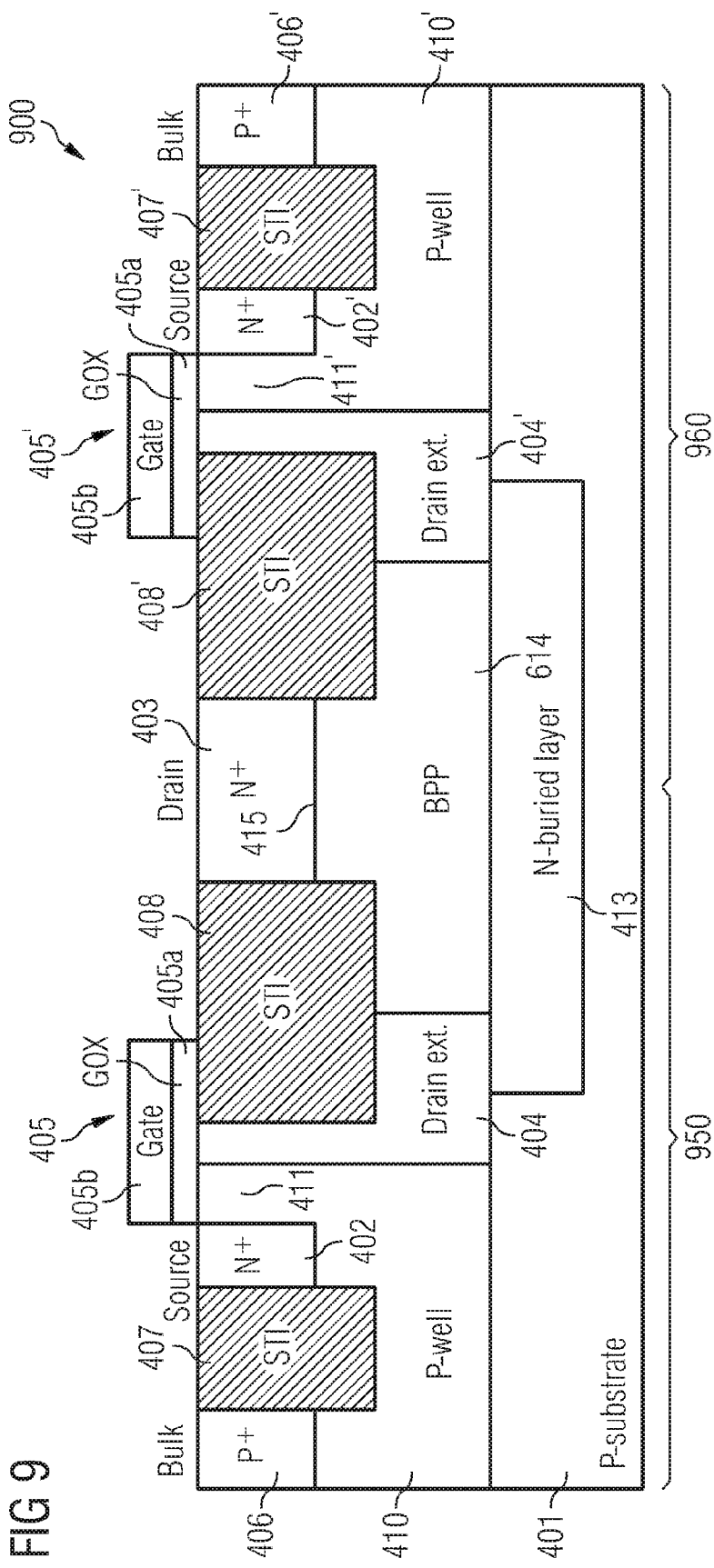
FIG. 9 shows a drain-extended field effect transistor in accordance with another embodiment of the invention.

FIG. 9 shows a drain-extended field effect transistor 900 in accordance with another embodiment of the invention. The drain-extended field effect transistor 900 is configured as a DE-NMOS device and has a folded layout (in other words, a mirror-symmetrical structure). Clearly, the drain-extended field effect transistor 900 may be obtained by mirroring the device of FIG. 6A to the right in a similar manner as described above in connection with FIG. 8. The obtained DE-NMOS device 900 has two device fingers 950 and 960, wherein a first device finger 950 corresponds to the device structure shown in FIG. 6A and a second device finger 960 corresponds to the mirrored device structure. The first and second device fingers 950, 960 of the DE-NMOS 900 may be configured, for example, in accordance with one or more embodiments described above in connection with FIG. 6A.

In accordance with another embodiment (not shown), the doping types of all doped regions in FIG. 9 may be reversed. That is, in accordance with this embodiment, all the n-doped regions of the transistor 900 become p-doped regions and vice versa such that a DE-PMOS device is obtained as described above in connection with FIG. 6B. In other words, a DE-PMOS device may be obtained by mirroring the device of FIG. 6B to the right in a similar manner as described above in connection with FIG. 9.

The DE-PMOS device obtained in the above-mentioned way would be formed in or on an n-type substrate. In accordance with another embodiment, a DE-PMOS device that is formed in or on a p-type substrate may, for example, be obtained by inverting the doping types of all doped regions but the substrate, and forming a deep N-band in the p-substrate, e.g., in a similar manner as described above in connection with the embodiments shown in FIG. 5 and FIG. 7.

Figure 10:
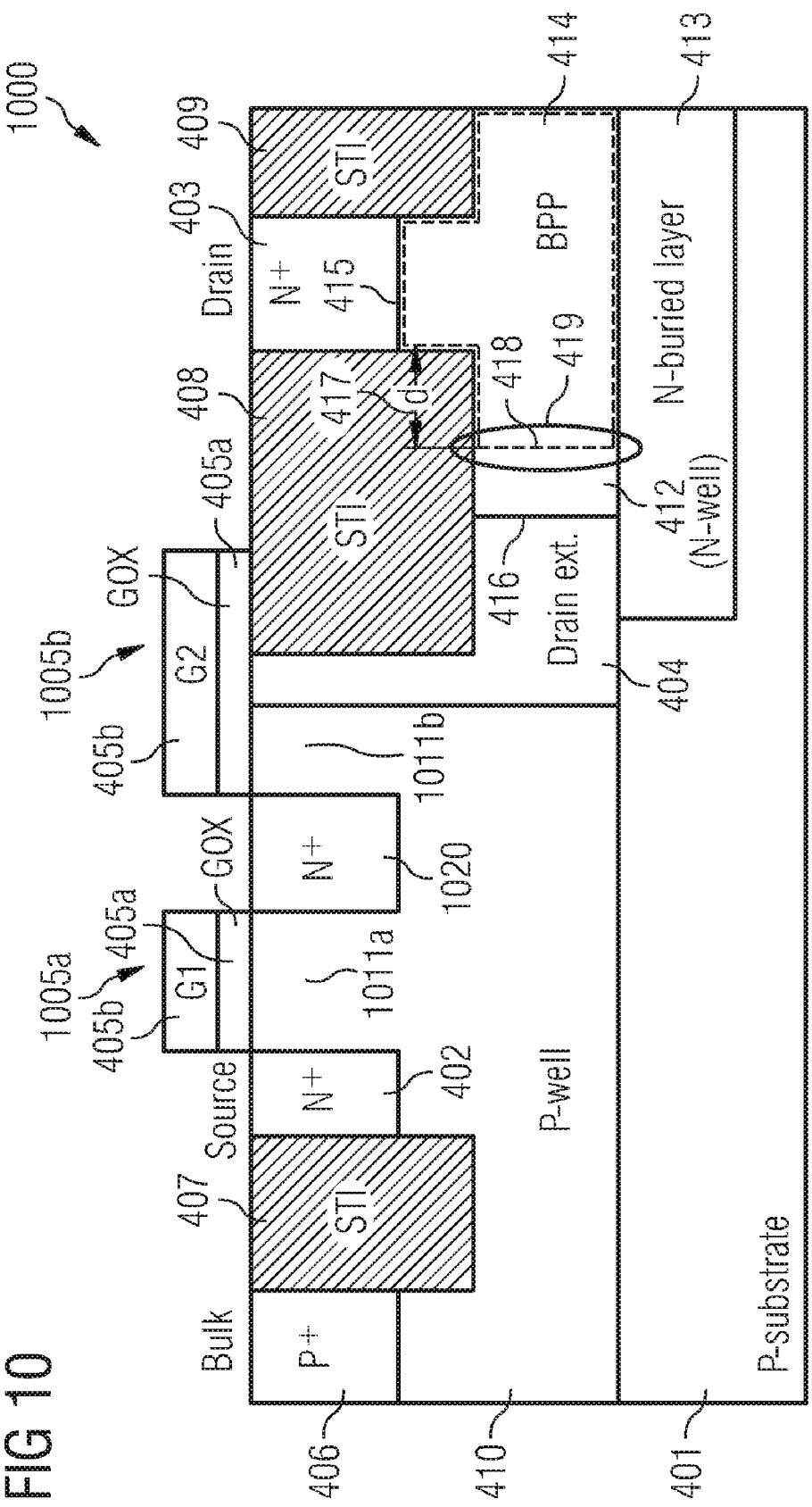
FIG. 10 shows a drain-extended field effect transistor in accordance with another embodiment of the invention.

FIG. 10 shows a drain-extended field effect transistor 1000 in accordance with another embodiment of the invention. The drain-extended field effect transistor 1000 is configured as a DE-NMOS device and differs from the DE-NMOS 400 of FIG. 4A in that the DE-NMOS 1000 further includes a diffusion region 1020 formed between the source contact region 402 and the drain extension region 404. The diffusion region 1020 is highly n-doped (n+ doped) and may have a similar dopant concentration level as one of the contact regions 402, 403, 406. For example, the diffusion region 1020 may have a dopant concentration level in the range from about $5 \times 10^{19}$ cm$^{-3}$ to about $10^{21}$ cm$^{-3}$ in accordance with some embodiments, for example, in the range from about $10^{20}$ cm$^{-3}$ to about $5 \times 10^{20}$ cm$^{-3}$ in accordance with one embodiment, e.g., $2 \times 10^{20}$ cm$^{-3}$ in one embodiment.

The n-doped diffusion region 1020 may, for example, be formed by means of a source/drain or HDD implantation, using, e.g., arsenic (As), phosphorous (P) or other suitable n-type dopants as implants. The diffusion region is formed in the substrate 401 and may have a depth that is similar to the depth of at least one of the contact regions 402, 403, 406.

The DE-NMOS 1000 further includes a first channel sub-region 1011a that is formed between the source contact region 402 and the diffusion region 1020, and a second channel sub-region 1011b that is formed between the diffusion region 1020 and the drain extension region 404. In other words, the first and second channel sub-regions 1011a, 1011b are separated from one another by the diffusion region 1020. The P-well region 410 extends under the diffusion region 1020 and may abut the drain extension region 404, as shown in FIG. 10. That is, the first and second channel sub-regions 1011a and 1011b may be formed within the well region 410, as shown in FIG. 10. In accordance with an alternative embodiment, the P-well region 410 may be separated from the drain extension region 404 by the substrate 401.

The DE-NMOS 1000 further includes a first gate sub-region 1005a and a second gate sub-region 1005b, wherein the first and second gate sub-regions 1005a, 1005b are separated from one another. Each of the gate sub-regions 1005a, 1005b includes a gate-insulating layer (gate oxide, GOX) and a conductive gate layer (Gate), referred to as "G1" in the case of the first gate sub-region 1005a, and as "G2" in the case of the second gate sub-region 1005b.

The first gate sub-region 1005a is formed on or above the first channel sub-region 1011a, and the second gate sub-region 1005b is formed on or above the second channel sub-region 1011b and on or above a part of the drain extension region 404. Furthermore, the second gate sub-region 1005b partially overlaps the second shallow trench isolation region 408.

It is noted that the first gate sub-region 1005a may partially overlap the source contact region 402 and/or the diffusion region 1020, and the second gate sub-region 1005b may partially overlap the diffusion region 1020.

Clearly, the DE-NMOS 1000 includes a gate region that has a split-gate structure with first and second gate sub-regions 1005a, 1005b, wherein the second gate sub-region 1005b corresponds to the gate region 405 shown in FIG. 4A. The first and second gate sub-regions 1005a, 1005b may be electrically connected to one another such that an electrical control potential may be applied to the two gates G1 and G2 at the same time. In accordance with an alternative embodiment, the gate sub-regions 1005a, 1005b may be electrically disconnected to allow for different electrical control potentials being applied to G1 and G2.

In accordance with other embodiments, a split-gate structure similar to the one shown in FIG. 10 may also be applied to one of the drain-extended field effect transistors described in connection with FIG. 3 to FIG. 9.

Figure 11:
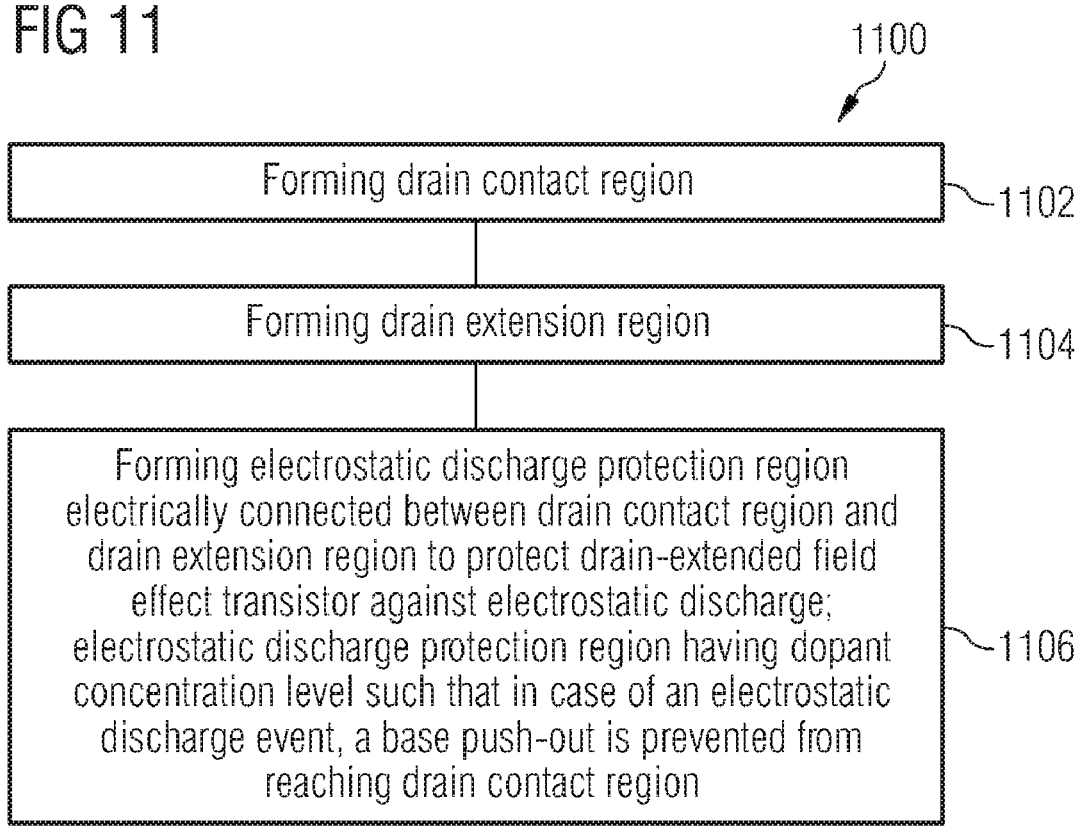
FIG. 11 shows a method of fabricating a drain-extended field effect transistor in accordance with another embodiment of the invention.

FIG. 11 shows a method 1100 of fabricating a drain-extended field effect transistor in accordance with another embodiment of the invention.

In 1102, a drain contact region is formed. The drain contact region may be configured in accordance with one or more of the embodiments described herein.

In 1104, a drain extension region is formed. The drain extension region may be configured in accordance with one or more of the embodiments described herein.

In 1106, an electrostatic discharge protection region is formed. The electrostatic discharge protection region is electrically connected between the drain contact region and the drain extension region to protect the drain-extended field effect transistor against electrostatic discharge. The electrostatic discharge protection region has a dopant concentration level such that in case of an electrostatic discharge event, a base push-out is prevented from reaching the drain contact region. The electrostatic discharge protection region may further be configured in accordance with one or more of the embodiments described herein.

Figure 12:
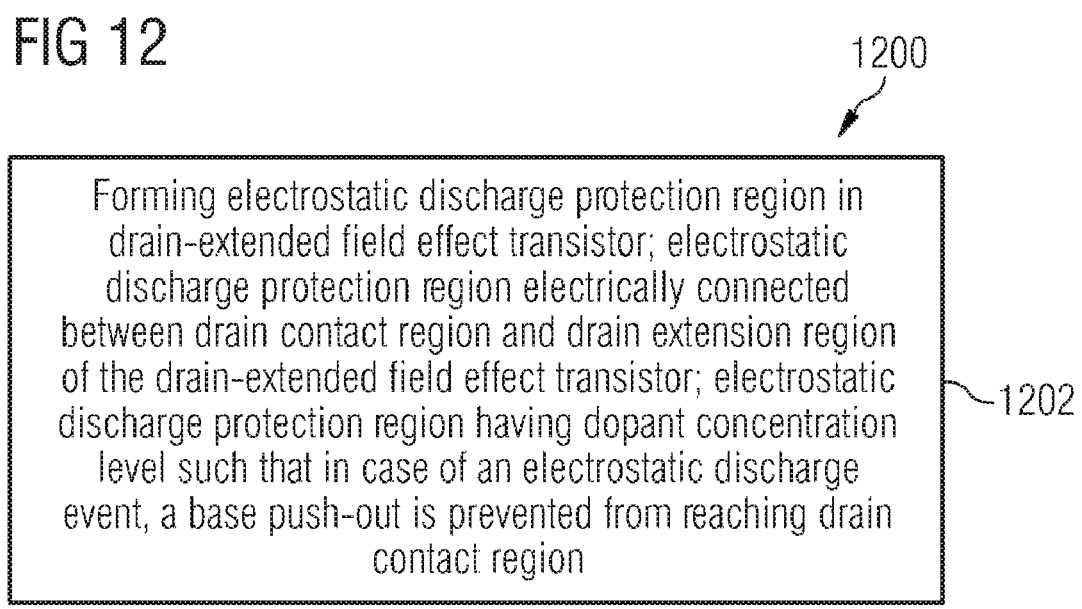
FIG. 12 shows a method of protecting a drain-extended field effect transistor against electrostatic discharge in accordance with another embodiment of the invention.

FIG. 12 shows a method 1200 of protecting a drain-extended field effect transistor against electrostatic discharge.

In 1202, an electrostatic discharge protection region is formed in the drain-extended field effect transistor. The electrostatic discharge protection region is electrically connected between a drain contact region of the drain-extended field effect transistor and a drain extension region of the drain-extended field effect transistor, and the electrostatic discharge protection region has a dopant concentration level such that in case of an electrostatic discharge event, a base push-out is prevented from reaching the drain contact region. The drain-extended field effect transistor and/or the electrostatic discharge protection region may further be configured in accordance with one or more of the embodiments described herein.

In accordance with another embodiment of the invention, a drain-extended field effect transistor is provided that includes a drain contact region, a drain extension region, and an electrostatic discharge protection region electrically connected between the drain contact region and the drain extension region to protect the drain-extended field effect transistor against electrostatic discharge. The electrostatic discharge protection region is doped, wherein the dopant concentration level is such that in case of an electrostatic discharge event, a base push-out is prevented from reaching the drain contact region.

In the following, additional features and potential effects of illustrative embodiments are described.

In accordance with some embodiments, devices and methods are provided to increase the intrinsic ESD failure limit in DEMOS devices.

In accordance with some embodiments, the topic of ESD properties of DEMOS devices is addressed in a new CMOS technology add-on based on (but not restricted to) a 130 nm process.

In accordance with some embodiments, DEMOS devices with self-protection capabilities are provided. In other words, self-protected DEMOS devices are provided that do not require any additional protection device(s) to protect themselves against electrostatic discharge.

In accordance with some embodiments, DEMOS devices are provided wherein an additional implantation of the same type as a drain extension but with a higher doping level is introduced. In accordance with some embodiments, this additional base push-out prevention (BPP) implant may embed the HDD and overlap the STI border of the HDD significantly. The doping level may be properly adjusted, such that a base push-out only leads to a shift of the maximum avalanche generation away from the drain extension/p-well junction to the junction of the BPP implant. The maximum temperature spot may be located near this area, so that it may be deeper in the silicon.

A DEMOS device in accordance with some embodiments may include a shallow trench isolation (STI) adjacent to the HDD. As in this case the current flows under the STI, a certain ballasting resistance may be maintained along the path to the contact. This may limit the capability (or tendency) of the device to form narrow current filaments.

In accordance with some embodiments, DEMOS devices (e.g., DE-NMOS or DE-PMOS devices) are provided that exhibit a strongly improved ESD robustness.

In accordance with an embodiment, an n-well implant may be used as a BPP implant for a DE-NMOS which limits the number of process steps.

In accordance with some embodiments, an additional implantation (also denoted as "new ESD implant") is used to prevent the base push-out effect to snap-back to an N+/N– well (N+=HDD) junction. This implant is also referred to as "base push-out prevention implant" or short "BPP implant". By means of this BPP implant, a region of maximum electric field and avalanche generation after a base push-out may be shifted away from the HDD and deeper into the substrate. In other words, by means of the BPP implant, a base push-out may be prevented from reaching the HDD.

In accordance with one embodiment, a drain extended MOS device is provided that includes an additional implant in the drain region embedding the highly doped drain (HDD) implant and having a certain underlap to the drain extension.

The dopant concentration level of this additional implantation may be between the dopant concentration level of the lowly doped drain extension and the dopant concentration level of the HDD. One effect of this modification is an improved device behavior in case of ESD stress. For example, the additional implant may prevent the device from strong base push-out if high current densities occur. This again may reduce the tendency to form destructive current filaments.

In accordance with some embodiments, a new DEMOS device concept is provided, wherein a strongly pronounced base push-out (or Kirk effect), which is usually present in conventional DEMOS devices, may be avoided or, at least, limited to higher currents. One effect of the new DEMOS device is an improved behavior during ESD stress or, in other words, an improved ESD hardness, as detrimental effects caused by a base push-out may be avoided.

In accordance with some embodiments, ESD self-protected DEMOS devices are provided that may, for example, be used as IO devices in integrated circuits. The ESD self-protection property of these devices may, for example, be used in the case of large line driver devices.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A drain-extended field effect transistor, comprising:
    a drain contact region;
    a drain extension region;
    an electrostatic discharge protection region electrically connected between the drain contact region and the drain extension region to protect the drain-extended field effect transistor against electrostatic discharge, wherein the electrostatic discharge protection region comprises a dopant concentration level such that, in case of an electrostatic discharge event, a base push-out is prevented from reaching the drain contact region; and
    a shallow trench isolation region, wherein the drain contact region is formed laterally adjacent to the shallow trench isolation region, wherein the shallow trench isolation region extends deeper into a substrate than the drain contact region, and wherein a portion of the electrostatic discharge protection region that is distal from the drain contact region extends under the shallow trench isolation region.

2. The drain-extended field effect transistor of claim 1,
    wherein the drain contact region, the drain extension region and the electrostatic discharge protection region are doped with a first type dopant;
    wherein a dopant concentration level of the drain contact region is higher than a dopant concentration level of the drain extension region; and
    wherein the dopant concentration level of the electrostatic discharge protection region is between the dopant concentration level of the drain extension region and the dopant concentration level of the drain contact region.

3. The drain-extended field effect transistor of claim 1, wherein the dopant concentration level of the electrostatic discharge protection region is in the range from about $10^{19}$ cm$^{-3}$ to about $10^{20}$ cm$^{-3}$.

4. The drain-extended field effect transistor of claim 2, further comprising:
    a well region electrically connected between the drain contact region and the drain extension region, the well region being doped with the first type dopant,
    wherein the electrostatic discharge protection region is formed within at least a part of the well region, and
    wherein a dopant concentration level of the well region is between the dopant concentration level of the drain extension region and the dopant concentration level of the electrostatic discharge protection region.

5. The drain-extended field effect transistor of claim 4, wherein:
    the dopant concentration level of the drain extension region is in the range from about $5\times10^{16}$ cm$^{-3}$ to about $5\times10^{17}$ cm$^{-3}$;
    the dopant concentration level of the well region is in the range from about $10^{17}$ cm$^{-3}$ to about $10^{19}$ cm$^{-3}$;
    the dopant concentration level of the electrostatic discharge protection region is in the range from about $10^{19}$ cm$^{-3}$ to about $10^{20}$ cm$^{-3}$; and
    the dopant concentration level of the drain contact region is in the range from about $5\times10^{19}$ cm$^{-3}$ to about $10^{21}$ cm$^{-3}$.

6. The drain-extended field effect transistor of claim 2, further comprising a buried layer doped with the first type dopant and formed under and electrically connected to at least one of the drain extension region or the electrostatic discharge protection region.

7. The drain-extended field effect transistor of claim 6, wherein the buried layer has a dopant concentration level in the range from about $5\times10^{16}$ cm$^{-3}$ to about $10^{18}$ cm$^{-3}$.

8. The drain-extended field effect transistor of claim 2, further comprising a substrate doped with a second type dopant different from the first type dopant, wherein the drain contact region, the drain extension region and the electrostatic discharge protection region are formed in or on the substrate.

9. The drain-extended field effect transistor of claim 8, further comprising a source contact region and a channel region formed in or on the substrate,
    wherein the source contact region is doped with the first type dopant and the channel region is doped with the second type dopant; and
    wherein the source contact region is laterally spaced apart from the drain extension region by at least the channel region.

10. The drain-extended field effect transistor of claim 9, further comprising a gate region formed on or above the channel region and at least a part of the drain extension region.

11. The drain-extended field effect transistor of claim 10, further comprising a diffusion region doped with the first type dopant and formed between the source contact region and the drain extension region,
    wherein the channel region comprises first and second channel sub-regions separated from one another by the diffusion region;
    wherein the gate region comprises first and second gate sub-regions separated from one another, and
    wherein the first gate sub-region is formed on or above the first channel sub-region and the second gate sub-region is formed on or above the second channel sub-region and the part of the drain extension region.

12. The drain-extended field effect transistor of claim 1,
    wherein the drain-extended field effect transistor has a mirror-symmetrical structure relative to the drain contact region, comprising a second drain extension region located mirror-symmetrically to the drain extension region; and wherein the electrostatic discharge protection region is further electrically connected between the drain contact region and the second drain extension region.

13. A drain-extended field effect transistor, comprising:
a drain contact region doped with a first type dopant;
a drain extension region doped with the first type dopant;
a well region doped with the first type dopant and electrically connected between the drain contact region and the drain extension region;
an electrostatic discharge protection region doped with the first type dopant and formed within at least a part of the well region; and
a shallow trench isolation region, wherein the drain contact region is formed laterally adjacent to the shallow trench isolation region, wherein a portion of the electrostatic discharge protection region that is distal from the drain contact region extends under the shallow trench isolation region, and wherein a portion of the well region is formed between the drain extension region and the portion of the electrostatic discharge protection region that extends under the shallow trench isolation region;
wherein a dopant concentration level of the electrostatic discharge protection region is between a dopant concentration level of the drain extension region and a dopant concentration level of the drain contact region, and is higher than a dopant concentration level of the well region.

14. The drain-extended field effect transistor of claim 13, wherein:
the dopant concentration level of the electrostatic discharge protection region is in the range from about $10^{19}$ cm$^{-3}$ to about $10^{20}$ cm$^{-3}$.

15. The drain-extended field effect transistor of claim 13, further comprising a buried layer doped with the first type dopant and formed under and electrically connected to at least one of the drain extension region or the electrostatic discharge protection region.

16. The drain-extended field effect transistor of claim 13, further comprising a substrate doped with a second type dopant different from the first type dopant, wherein the drain contact region, the drain extension region and the well region are formed in or on the substrate.

17. The drain-extended field effect transistor of claim 16, further comprising a source contact region and a channel region formed in or on the substrate,
wherein the source contact region is doped with the first type dopant and the channel region is doped with the second type dopant, and
wherein the source contact region is laterally spaced apart from the drain extension region by at least the channel region.

18. The drain-extended field effect transistor of claim 17, further comprising a gate region formed on or above the channel region and at least a part of the drain extension region.

19. The drain-extended field effect transistor of claim 18, further comprising a diffusion region doped with the first type dopant and formed between the source contact region and the drain extension region,
wherein the channel region comprises first and second channel sub-regions separated from one another by the diffusion region;
wherein the gate region comprises first and second gate sub-regions separated from one another, and
wherein the first gate sub-region is formed on or above the first channel sub-region and the second gate sub-region is formed on or above the second gate sub-region and the part of the drain extension region.

20. The drain-extended field effect transistor of claim 13, wherein the drain-extended field effect transistor has a mirror-symmetrical structure relative to the drain contact region, comprising a second drain extension region formed mirror-symmetrically to the drain extension region; and
wherein the electrostatic discharge protection region is further electrically connected between the drain contact region and the second drain extension region.

21. A method of fabricating a drain-extended field effect transistor, the method comprising:
forming a drain contact region;
forming a drain extension region;
forming an electrostatic discharge protection region that is electrically connected between the drain contact region and the drain extension region to protect the drain-extended field effect transistor against electrostatic discharge, wherein the electrostatic discharge protection region comprises a dopant concentration level such that, in case of an electrostatic discharge event, a base push-out is prevented from reaching the drain contact region; and
forming a shallow trench isolation region, wherein the drain contact region is formed laterally adjacent to the shallow trench isolation region, wherein the shallow trench isolation region extends deeper into a substrate than the drain contact region, and wherein a portion of the electrostatic discharge protection region that is distal from the drain contact region extends under the shallow trench isolation region.

22. A drain-extended field effect transistor, comprising:
a base push-out prevention implantation formed within a region electrically connected between a highly doped drain implantation region and a lowly doped drain extension region of the drain-extended field effect transistor; and
a shallow trench isolation region, wherein the highly doped drain implantation region is formed laterally adjacent to the shallow trench isolation region, wherein the shallow trench isolation region extends deeper into a substrate than the highly doped drain implantation region, and wherein a portion of the base push-out prevention implantation that is distal from the highly doped drain implantation region extends under the shallow trench isolation region;
wherein the base push-out prevention implantation comprises a dopant concentration level that is between a dopant concentration level of the lowly doped drain extension region and a dopant concentration level of the highly doped drain implantation region, and is such that in case of an electrostatic discharge event, a base push-out is prevented from reaching the highly doped drain implantation region.

23. A method of protecting a drain-extended field effect transistor against electrostatic discharge, the drain-extended field effect transistor comprising a drain contact region, a drain extension region and a shallow trench isolation region, the shallow trench isolation extending deeper into a substrate than the drain contact region and the drain contact region being formed laterally adjacent to the shallow trench isolation region, the method comprising:
forming an electrostatic discharge protection region in the drain-extended field effect transistor, wherein a portion of the electrostatic discharge protection region that is distal from the drain contact region extends under the shallow trench isolation region, wherein the electrostatic discharge protection region is electrically connected between the drain contact region and the drain extension region of the drain-extended field effect transistor, and wherein the electrostatic discharge protection region comprises a dopant concentration level such that in case of an electrostatic discharge event, a base push-out is prevented from reaching the drain contact region.

* * * * *